United States Patent
Wang et al.

(10) Patent No.: US 10,241,615 B2
(45) Date of Patent: Mar. 26, 2019

(54) TOUCH SUBSTRATE AND DISPLAY APPARATUS

(71) Applicants: BOE TECHNOLOGY GROUP CO., LTD., Beijing (CN); Beijing BOE Optoelectronics Technology Co., Ltd., Beijing (CN)

(72) Inventors: Pengpeng Wang, Beijing (CN); Xue Dong, Beijing (CN); Xiaochuan Chen, Beijing (CN); Haisheng Wang, Beijing (CN); Xiaoliang Ding, Beijing (CN); Yingming Liu, Beijing (CN); Shengji Yang, Beijing (CN); Weijie Zhao, Beijing (CN); Changfeng Li, Beijing (CN); Wei Liu, Beijing (CN); Jian Gao, Beijing (CN); Xiaochen Niu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/536,184

(22) PCT Filed: Jul. 11, 2016

(86) PCT No.: PCT/CN2016/089616
§ 371 (c)(1),
(2) Date: Jun. 15, 2017

(87) PCT Pub. No.: WO2017/152561
PCT Pub. Date: Sep. 14, 2017

(65) Prior Publication Data
US 2018/0113556 A1  Apr. 26, 2018

(30) Foreign Application Priority Data

Mar. 11, 2016  (CN) .......................... 2016 1 0141617

(51) Int. Cl.
G06F 3/041 (2006.01)
G06F 3/045 (2006.01)
(Continued)

(52) U.S. Cl.
CPC ............ G06F 3/0416 (2013.01); G06F 3/045 (2013.01); G06F 3/0412 (2013.01);
(Continued)

(58) Field of Classification Search
CPC ...... G06F 3/0416; G06F 3/045; G06F 3/0412; G06F 2203/04111; G06F 2203/04105;
(Continued)

(56) References Cited

U.S. PATENT DOCUMENTS 8,803,827 B2    8/2014 Nozawa
2005/0242713 A1* 11/2005 Yamazaki ........... H01L 51/5284
                                                313/503
(Continued)

FOREIGN PATENT DOCUMENTS

CN    102520833 A    6/2012
CN    103500040 A    1/2014
(Continued)

OTHER PUBLICATIONS

International Search Report date Dec. 14, 2016 in corresponding International Application No. PCT/CN2016/089616 along with an English translation of the International Search Report and an English translation of the Written Opinion of the International Searching Authority.
(Continued)

*Primary Examiner* — Liliana Cerullo
(74) *Attorney, Agent, or Firm* — Nath, Goldberg & Meyer; Joshua B. Goldberg

(57) ABSTRACT

The present disclosure provides touch substrate and display apparatus, belonging to field of display technology. The touch substrate includes a substrate, and a plurality of control lines, a plurality of read lines and a plurality of touch
(Continued)

control units disposed on the substrate; each touch control unit includes a first patch disposed on first surface of the substrate and a second patch disposed on second surface of the substrate opposite to the first surface, orthogonal projection of the first patch at least partially overlapping with that of the second patch, the first and second patches being electrically connected through conductive via penetrating the substrate; each touch control unit operates under control of control signal inputted through corresponding control line, and read, through corresponding read line, pressure signal for the first and second patches in the touch control unit to determine position of touch point at which a press occurs.

19 Claims, 2 Drawing Sheets

(51) Int. Cl.
  *H01L 27/32* (2006.01)
  *H01L 51/00* (2006.01)
  *H01L 51/52* (2006.01)

(52) U.S. Cl.
  CPC ........ *H01L 27/323* (2013.01); *H01L 27/3276* (2013.01); *H01L 51/0096* (2013.01); *G06F 2203/04103* (2013.01); *G06F 2203/04105* (2013.01); *G06F 2203/04106* (2013.01); *G06F 2203/04111* (2013.01); *H01L 27/322* (2013.01); *H01L 51/5284* (2013.01)

(58) Field of Classification Search
  CPC .. H01L 27/323; H01L 27/322; H01L 51/5284
  See application file for complete search history.

(56) References Cited

U.S. PATENT DOCUMENTS

| | | | |
|---|---|---|---|
| 2009/0073138 A1* | 3/2009 | Lee | G06F 3/0412 345/173 |
| 2010/0328208 A1* | 12/2010 | Austin | G06F 3/03547 345/157 |
| 2012/0044191 A1 | 2/2012 | Shin | |
| 2013/0009905 A1* | 1/2013 | Castillo | G06F 3/044 345/174 |
| 2013/0293482 A1 | 11/2013 | Burns et al. | |
| 2016/0004364 A1 | 1/2016 | Hu et al. | |
| 2016/0147353 A1* | 5/2016 | Filiz | G01L 1/18 345/174 |
| 2016/0349882 A1 | 12/2016 | Liu et al. | |

FOREIGN PATENT DOCUMENTS

| | | |
|---|---|---|
| CN | 104411620 A | 3/2015 |
| CN | 104850292 A | 8/2015 |
| CN | 105094449 A | 11/2015 |
| CN | 105739788 A | 7/2016 |
| WO | 2010/131551 A1 | 11/2010 |

OTHER PUBLICATIONS

Chinese office action dated Nov. 3, 2017 for corresponding CN application 201610141617.4 with English translation attached.
Second Office Action dated Apr. 27, 2018 in corresponding Chinese Patent Application No. CN 201610141617.4.

* cited by examiner

TOUCH SUBSTRATE AND DISPLAY APPARATUS

This is a National Phase Application filed under 35 U.S.C. 371 as a national stage of PCT/CN2015/089616, filed Jul. 11, 2016, an application claiming the benefit of Chinese Application No. 201610141617.4, filed Mar. 11, 2016, the content of each of which is hereby incorporated by reference in its entirety.

FIELD

The present invention belongs to the field of display technology, and specifically relates to a touch substrate and a display apparatus.

BACKGROUND

A touch screen, due to its advantages such as ease of operation, visualization and flexibility, has become a popular human-computer interaction means for personal mobile communication device and integrated information terminal (e.g., tablet computers, smart phones, super notebook computers, etc.). Depending on different principles of touch control, touch screens can be divided into four main types of resistive touch screen, capacitive touch screen, infrared touch screen and surface acoustic wave (SAW) touch screen. A capacitive touch screen has a multi-touch function, and has an excellent user experience with fast response, long lifetime and high light transmission. With gradual development of the process, the yield of the capacitive touch screen has been significantly improved, and its price has been increasingly reduced, thereby becoming a mainstream technology for touch control interaction of small and medium-sized information terminal.

However, it has been found that there is a lack of realizing touch control by using pressure sensors in the field of touch control. Accordingly, the present disclosure provides, inter alia, a technical solution of adopting, as a pressure sensor, resistive strain gauges in the touch screen to realize touch control.

SUMMARY

In view of the above problems in the existing touch substrates, the present disclosure provides a touch substrate and a display apparatus, in which pressure sensors are applied to realize touch control.

The technical solution at least solving the technical problems in the present invention is a touch substrate, which includes a substrate, and a plurality of control lines, a plurality of read lines and a plurality of touch control units disposed on the substrate, wherein each of the plurality of touch control units includes a first patch disposed on a first surface of the substrate, and a second patch disposed on a second surface of the substrate opposite to the first surface, an orthogonal projection of the first patch on the substrate at least partially overlapping with that of the second patch, the first and second patches being electrically connected through a conductive via penetrating the substrate; and each of the plurality of touch control units is configured to operate under a control of a control signal inputted through a corresponding one of the plurality of control lines, and read out, through a corresponding one of the plurality of read lines, a pressure signal for the first and second patches in the touch control unit so as to determine a position of a touch point at which a press occurs.

Optionally, the plurality of control lines and the plurality of read lines intersect and are insulated from each other, each intersection of the plurality of control lines and the plurality of read lines defining one of the touch control units; wherein each of the plurality of touch control units further includes a switch transistor having a first electrode electrically connected to the first and second patches of the touch control unit, respectively; second electrodes of the switch transistors of the touch control units in a same column are commonly connected to a same one of the plurality of read lines, and control electrodes of the switch transistors of the touch control units in a same row are commonly connected to a same one of the plurality of control lines.

Optionally, each of the plurality of touch control units further includes a detecting and amplifying unit, which is configured to convert, to the pressure signal, a difference in resistance values of the first patch and the second patch of the touch control unit, amplify the pressure signal and output the amplified pressure signal through the read line.

Further optionally, the detecting and amplifying unit is configured to be a bridge detection circuit, and the first and second patches of one touch control unit serve as two respective resistors of a bridge in the detecting and amplifying unit of the one touch control unit.

Further optionally, the detecting and amplifying unit includes an amplifying circuit, a switch transistor, a first resistor and a second resistor, wherein the first resistor, the second resistor, the first patch and the second patch constitute the bridge in the detecting and amplifying unit, a node at which the first resistor and the first patch are connected serving as a first end of the bridge, a node at which the first patch and the second patch are connected serving as a second end of the bridge, a node at which the second patch and the second resistor are connected serving as a third end of the bridge, a node at which the second resistor and the first resistor are connected serving as a fourth end of the bridge; the amplifying circuit has a first input port, a second input port and an output port, and is configured to output the pressure signal in a form of voltage; and wherein a first electrode of the switch transistor is connected to the second end of the bridge, and a second electrode of the switch transistor is connected to the first input port of the amplifying circuit; the first end of the bridge is connected to a power supply voltage port, the third end of the bridge is connected to a low voltage port or a ground port, and the fourth end of the bridge is connected to the second input port of the amplifying circuit.

Further optionally, the amplifying circuit includes a fifth resistor, a sixth resistor, a seventh resistor, an eighth resistor and an operational amplifier, wherein the operational amplifier has a positive input port, a negative input port and an output port; a first end of the fifth resistor is connected to the first input port of the amplifying circuit, a second end of the fifth resistor is connected to the negative input port of the operational amplifier and a first end of the seventh resistor; a first end of the sixth resistor is connected to the second input port of the amplifying circuit, and a second end of the sixth resistor is connected to the positive input port of the operational amplifier and a first end of the eighth resistor; a second end of the seventh resistor is connected to the output port of the operational amplifier, which serves as the output port of the amplifying circuit; and a second end of the eighth resistor is connected to a reference voltage port.

Optionally, the bridge is a Wheatstone bridge.

Optionally, the touch substrate further includes an acquisition unit and a processing unit; wherein the acquisition unit is configured to acquire pressure signals which are read through respective read lines; and the processing unit is configured to analyze and process the pressure signals to determine the position of the touch point at which a press occurs.

Optionally, each of the first patch and the second patch has a spiral wiring pattern.

Further optionally, the spiral wiring pattern is configured to be a circular spiral wiring pattern or a square spiral wiring pattern.

Optionally, in each touch control unit, the orthogonal projection of the first patch on the substrate completely overlaps with that of the second patch.

Optionally, each of the first patch and the second patch is a resistive strain gauge.

Optionally, each of the first electrode and the second electrode is made of any one of constantan, an alloy of nickel and aluminum, a Kama alloy, and an alloy of iron, chromium and aluminum.

Optionally, the touch substrate is any one of a color filter substrate, an array substrate, and an organic light-emitting diode substrate.

Further optionally, the touch substrate is a color filter substrate including a black matrix, and the touch control units are disposed in correspondence with a position of the black matrix.

The technical solution at least solving the technical problems in the present invention is a display apparatus including the touch substrate described herein and a counter substrate disposed opposite to the touch substrate.

Optionally, in a case where the touch substrate is an array substrate or an organic light-emitting diode substrate, the counter substrate is provided with pressure conductive pillars thereon at positions corresponding to the touch control units, respectively, the pressure conductive pillars and the touch substrate being provided with a gap therebetween.

Optionally, the display apparatus further includes spacers disposed between the counter substrate and the touch substrate, the spacers and the pressure conductive pillars being disposed at a same layer and made of a same material.

The beneficial effects of the present disclosure are as follows.

In the touch substrate according to embodiments of the present invention, when a press occurs at a first surface of the substrate, the first patch of the touch control unit corresponding to the press position is compressed because of being subjected to pressure, which makes its resistance value smaller, and the second patch disposed on the second surface of the substrate and opposite to the first patch is stretched because of being subjected to tension, which makes its resistance value larger. As compared to the case where the first and second patches are otherwise arranged, the second patch disposed directly opposite to the first patch is affected more by the tension, so that the magnitude of the pressure signal corresponding to the difference in resistance values of the first patch and the second patch is larger. Thus, the position of the touch point where a press occurs can be determined more accurately by the pressure signals of respective touch control units read through the read lines.

Figure 1:
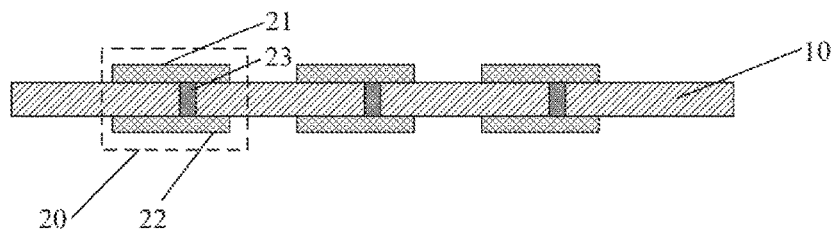
FIG. 1 is a schematic structural diagram of a touch substrate according to an embodiment of the present invention.

Reference numerals: 10. substrate; 20. touch control unit; 30. control line; 40. read line; 50. pressure conductive pillar; 60. detecting and amplifying unit; 70. black matrix; 80. counter substrate; 21. first patch; 22. second patch; 23. conductive via; 61. bridge; 62. amplifying circuit; 621. operational amplifier; T1. switch transistor.

DETAILED DESCRIPTION

To make those skilled in the art better understand the technical solutions of the present disclosure, the present disclosure will be further described in detail below in conjunction with the accompanying drawings and specific implementations.

In one aspect, as illustrated in FIG. 1, embodiments of the present invention provide a touch substrate, which includes a substrate 10, and a plurality of control lines 30 (see FIG. 4), a plurality of read lines 40 (see FIG. 4) and a plurality of touch control units 20 disposed on the substrate 10. Optionally, each of the plurality of touch control units 20 includes a first patch 21 disposed on a first surface of the substrate 10, and a second patch 22 disposed on a second surface of the substrate 10 opposite to the first surface, and an orthogonal projection of the first patch 21 (e.g., on the substrate 10) at least partially overlaps with that of the second patch 22, the first and second patches 21 and 22 being electrically connected through a conductive via 23 penetrating the substrate 10. Each of the plurality of touch control units 20 is configured to operate under a control of a control signal inputted through a corresponding control line 30, and read out, through a corresponding read line 40, a pressure signal for the first and second patches 21 and 22 in the touch control unit 20 so as to determine a position of a touch point at which a press occurs. It can be understood that one pressure signal is determined by a pair of the first patch 21 and the second patch 22 together.

Optionally, each of the first patch 21 and the second patch 22 is a resistive strain gauge. When a press occurs at the first surface of the substrate 10 of the touch substrate, the first patch 21 of the touch control unit 20 at the press position is compressed because of being subjected to pressure, which makes its resistance value smaller, and the second patch 22 disposed on the second surface of the substrate 10 and opposite to the first patch 21 is stretched because of being subjected to tension, which makes its resistance value larger. At this time, the pressure signal corresponding to a difference in resistance values of the first patch 21 and the second patch 22 is read out through the read line 40, i.e., it is detected whether the pressure signal corresponding to the first and second patches 21 and 22 is changed or not, and then the pressure signal is processed by a processer to determine a position of a touch point at which the press occurs. For example, the pressure signal may be a voltage signal converted from the difference in resistance values of the first patch 21 and the second patch 22.

Optionally, the first patch 21 and the second patch 22 are disposed directly opposite to each other in each touch control unit 20, that is, in each touch control unit 20, the orthogonal projection of the first patch 21 on the substrate 10 completely overlaps with that of the second patch 22. In this case, when a press occurs at a first surface (that is, a surface at the side of the first surface of the substrate 10) of the touch substrate, the first patch 21 of the touch control unit 20 at the press position is compressed because of being subjected to pressure, which makes its resistance value smaller; as compared to the case where the first and second patches 21 and 22 are otherwise arranged, the second patch 22 disposed directly opposite to the first patch 21 is affected more by the tension, resulting in that the second patch 22 is stretched larger and a variation amount (an increment) of the resistance value of the second patch 22 is greater, so that the magnitude of the pressure signal corresponding to the difference in resistance values of the first patch 21 and the second patch 22 is larger. Thus, the position of the touch point where a press occurs can be determined more accurately by the pressure signals of respective touch control units 20 read through the read lines 40.

According to an embodiment of the present invention, each touch control unit 20 further includes a detecting and amplifying unit 60, which is configured to convert, to the pressure signal, the difference in resistance values of the first patch 21 and the second patch 22 in the same touch control unit 20, amplify the pressure signal and output the amplified pressure signal through the read line 40. The detecting and amplifying unit 60 is disposed for the reason that, when a press is received, the resistance of the first patch 21 in the touch control unit 20 varies opposite to that of the second patch 22, and specifically, the resistance of the first patch 21 at the press side is reduced while the resistance of the second patch 22 disposed opposite to the first patch 21 is increased; at this time, the detecting and amplifying unit 60 may calculate a voltage signal (i.e., the pressure signal) depending on the difference in resistance values of the first patch 21 and the second patch 22, and amplify the voltage signal, and thus it is possible to detect, with higher accuracy, a position of the touch control unit 20 at which a change of the pressure signal occurs, so as to better determine the position of the touch point where the press occurs.

Optionally, the detecting and amplifying unit 60 includes a switch unit, which may be a switch transistor T1; an amplifying circuit 62 having a first input port, a second input port and an output port; and a first resistor R1 and a second resistor R2. The detecting and amplifying unit 60 may be configured to be a detection circuit with a bridge, wherein the first and second patches 21 and 22 serve as two resistors of the bridge, respectively, and the bridge may be a Wheatstone bridge.

Figure 2:
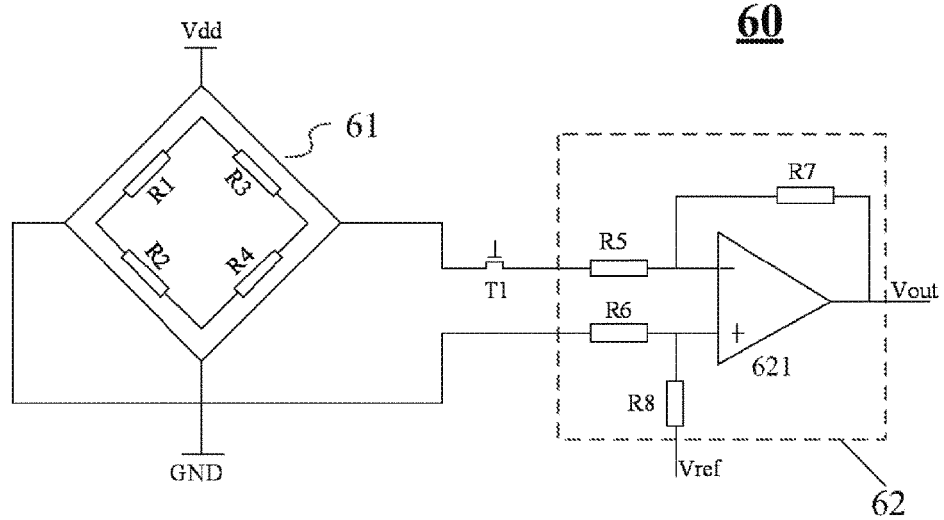
FIG. 2 is a circuit diagram of a detecting and amplifying unit of a touch substrate according to an embodiment of the present invention.

Specifically, the first patch 21 in the touch control unit 20 may serve as a third resistor R3 as illustrated in FIG. 2, and the second patch 22 in the touch control unit 20 may serve as a fourth resistor R4 as illustrated in FIG. 2, both of the first and second patches 21 and 22 and first and second resistors R1 and R2 constituting a bridge 61 in the detecting and amplifying unit 60. Optionally, a node at which the first resistor R1 and the third resistor R3 are connected serves as a first end of the bridge 61, which is connected to a power supply voltage port Vdd; a node at which the third resistor R3 and the fourth resistor R4 are connected serves as a second end of the bridge 61, which is connected to a first electrode of the switch transistor T1; a node at which the fourth resistor R4 and the second resistor R2 are connected serves as a third end of the bridge 61, which is connected to a low voltage port (or a grounding port) GND; and a node at which the second resistor R2 and the first resistor R1 are connected serving as a fourth end of the bridge 61, which is connected to the second input port of the amplifying circuit 62. A second electrode of the switch transistor T1 is connected to the first input port of the amplifying circuit 62, and a control electrode of the switch transistor T1 is connected to the control line 30.

As illustrate in FIG. 2, the amplifying circuit 62 may include a fifth resistor R5, a sixth resistor R6, a seventh resistor R7, an eighth resistor R8 and an operational amplifier 621. The operational amplifier 621 has a positive input port (indicated by a sign "+" in FIG. 2), a negative input port (indicated by a sign "−" in FIG. 2) and an output port. A first end of the fifth resistor R5 is connected to the first input port of the amplifying circuit 62, a second end of the fifth resistor R5 is connected to the negative input port of the operational amplifier 621; a first end of the sixth resistor R6 is connected to the second input port of the amplifying circuit 62, and a second end of the sixth resistor R6 is connected to the positive input port of the operational amplifier 621; a first end of the seventh resistor R7 is connected to the negative input port of the operational amplifier 621, and the second end of the seventh resistor R7 is connected to the output port of the operational amplifier 621; a first end of the eighth resistor R8 is connected to the positive input port of the operational amplifier 621, and a second end of the eighth resistor R8 is connected to a reference voltage port Vref. The operational amplifier 621 outputs, through its output port, an amplified pressure signal to the read line 40.

Temperatures of the first and second patches 21 and 22 in each touch control unit 20 can be considered as the same due to the fact that the first and second patches 21 and 22 in each touch control unit 20 are disposed very close to each other. When no press occurs, the detecting and amplifying unit 60 outputs zero; even in a case where an environment temperature is changed, variations of the resistances of the two patches are the same, so the detecting and amplifying unit 60 still outputs zero, thereby eliminating the influence of temperature to some extent. When a control signal for turning on the touch control unit 20 is provided through the control line 30, the pressure signal may be obtained by the detecting and amplifying unit 60, and then the pressure signals on respective read lines 40 are acquired and converted, from an analog form to a digital form, by an acquisition unit (not shown in the drawings) of the touch substrate, and the converted signal is transmitted to a processing unit of the touch substrate to be further processed so as to determine the position of the touch point.

Hereinafter, the case where the first patch 21 and the second patch 22 in the touch control unit 20 are subjected to stress will be analyzed. When a press is applied to a screen by a finger, the case of the first and second patches 21 and 22 being subject to stress is approximately simplified, for ease of analysis, to a case of a girder with two ends fixed. That is, a strain of the first patch 21, at a distance x from the position where the pressure is applied, is calculated as follows:

$$\varepsilon_x = \frac{-5F}{61Ebh^2L^3}(240x^4 - 144x^2 + 7L^4),$$

where $\varepsilon_x$ is an axial strain of the first patch 21, F is the applied pressure, L is an equivalent length of the girder (i.e., the patch), b is an equivalent width of the girder, h is an equivalent thickness of the girder, E is a modulus of elasticity, and x is a distance from the position where the pressure is applied.

Therefore, the strain of the first patch 21 at the position (i.e., a position where x=0) where the pressure is applied is:

$$\varepsilon_x(0) = \frac{-35FL}{61Ebh^2};$$

the strain of the first patch 21 at an edge of the girder (i.e., a position where x=±L/2) is:

$$\varepsilon_x\left(\pm\frac{L}{2}\right) = \frac{70FL}{61Ebh^2};$$

similarly, it can be calculated that magnitudes of the strain of the second patch 22 and the strain of the first patch 21 are equal while signs of the strains of the first and second patches 21 and 22 are opposite. Thus, by the arrangement of the first and second patches 21 and 22 as illustrated in FIG. 1, a decrement in the resistance of the first patch 21 exactly equals to an increment in the resistance of the second patch 22. Therefore, when a press occurs, the pressure signal obtained by the bridge detection circuit such as the detection amplifying unit 60 becomes large, thereby improving the detection accuracy.

Optionally, each of the first patch 21 and the second patch 22 is a metal strain gauge, and is made of any one of constantan, an alloy of nickel and aluminum, a Kama alloy (NiCr$_{20}$AlSi) and an alloy of iron, chromium and aluminum, or other noble metals. The substrate 10 of the touch substrate may be a glass substrate 10 provided with a conductive via 23 in advance. The sensitivity coefficient K of the metal strain gauges (the first patch 21 and the second patch 22) is defined by the following formula:

$$K = \frac{\Delta R/R}{\Delta l/l} = \frac{\Delta R/R}{\varepsilon};$$

where ΔR is a variation amount of the resistance of the metal strain gauge, R is a resistance value of the metal strain gauge, Δl is a stretched (or compressed) amount of the metal strain gauge by deformation, l is the length of the metal strain gauge, and ε is a vertical strain of the metal strain gauge. When the metal strain gauge is subjected to a stress F, it will be stretched (or compressed) by Δl, and accordingly, the cross sectional area of the metal strain gauge is reduced (or increased) by ΔS, and the resistivity of the metal strain gauge is changed by an amount Δρ due to the deformation of crystal lattice, resulting in that the resistance is changed by ΔR. The resistance R of the metal strain gauge is calculated by the following formula:

$$R = \rho\frac{l}{S};$$

its total derivative is:

$$\frac{\Delta R}{R} = \frac{\Delta l}{l} - \frac{\Delta S}{S} + \frac{\Delta\rho}{\rho};$$

which eventually simplifies to:

$$\frac{\Delta R}{R} = (1+2\mu)\varepsilon + \frac{\Delta\rho}{\rho},$$

where μ is the Poisson's ratio of a strain material. In the present disclosure, the variation Δρ in the resistivity ρ of the selected strain gauge material is small and negligible when it is applied with a pressure. It can be seen from the above equation that when the term having ρ is neglected, the pressure sensitivity K is only related to the deformation amount.

Figure 3:
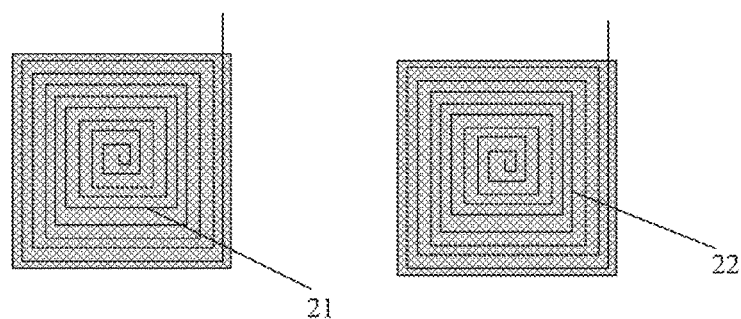
FIG. 3 is a schematic structural diagram of first and second patches of a touch substrate according to an embodiment of the present invention.

Optionally, as illustrated in FIG. 3, each of the first patch 21 and the second patch 22 in the touch control unit 20 has a spiral wiring pattern. Further, the spiral wiring pattern is a circular spiral wiring pattern or a square spiral wiring pattern. This wiring pattern is provided for the reason that, when a press is applied to the touch screen by a finger, the touch substrate is subjected to forces in different directions after being deformed, all these forces in different directions can be decomposed into components in x and y directions perpendicular to each other, wherein the x direction may be the horizontal direction in FIG. 3, and the y direction may be the vertical direction in FIG. 3. Therefore, the wiring patterns of the first and second patches 21 and 22 may be designed to include portions perpendicular to each other and capable of sensing forces in the x and y directions, respectively. As such, the portions of the wiring patterns of the first and second patches 21 and 22 extending in the y direction are provided to sense the component of the force in the y direction, while the portions of the wiring patterns of the first and second patches 21 and 22 extending in the x direction are provided to sense the component of the force in the x direction, and thus the pressure information can be acquired to the greatest extent. Needless to say, the first and second patches 21 and 22 may also be designed in other form such as a radial pattern, as long as the pressure information can be acquired to the greatest extent.

Figure 4:
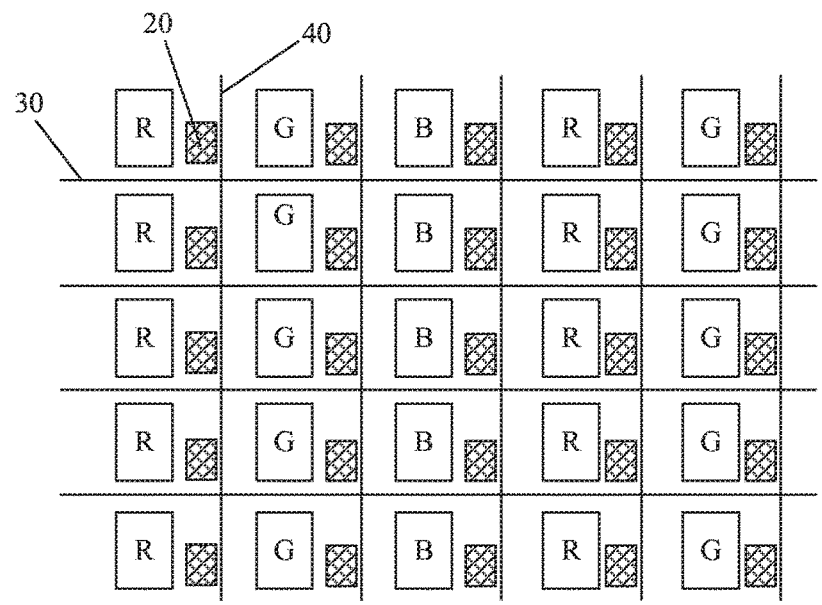
FIG. 4 is a schematic structural diagram of a touch substrate according to an embodiment of the present invention.

As illustrated in FIG. 4, according to an embodiment of the present embodiment, the plurality of control lines 30 and the plurality of read lines 40 in the touch substrate intersect and are insulated from each other, each intersection of the plurality of control lines 30 and the plurality of read lines 40 defining one of the touch control units 20; wherein each of the plurality of touch control units 20 further includes a switch transistor (not illustrated in FIG. 4) having a first electrode electrically connected to the first and second patches 21 and 22 in a same touch control unit 20, respectively; second electrodes of the switch transistors of the touch control units 20 in a same column are commonly connected to a same read line 40, and control electrodes of the switch transistors of the touch control units 20 in a same row are commonly connected to a same control line 30. By this arrangement, the wiring is made simple and it is easy to detect the position of the touch point. Specifically, when a signal for activating a first row of the touch control units 20 is inputted through the control line 30 in the first row, the switch transistors of the first row of the touch control units 20 are turned on, and in this case, if a variation of the pressure signal of an touch control unit 20 in the first row is read through one of the plurality of read lines, it is determined that a press occurs at a position of the X-th touch control unit in the first row. This approach is simple and easy to implement. The structure of the touch control unit 20 is the same as that described above, and will not be described in detail herein.

Figure 5:
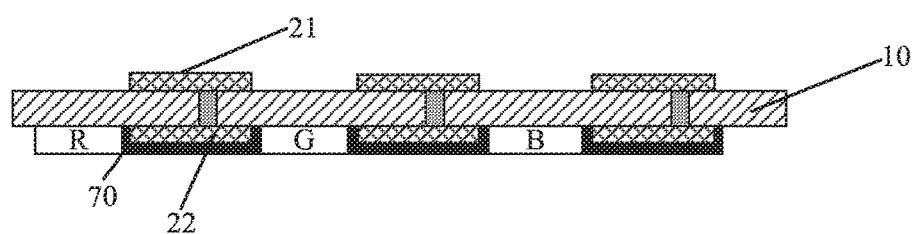
FIG. 5 is a schematic diagram illustrating a touch substrate according to an embodiment of the present invention as a color filter substrate.

Optionally, the touch substrate according to embodiments of the present invention may be a color filter substrate, which includes color filters of different colors and a black matrix 70 disposed between two adjacent color filters, wherein the second patches 22 of the touch control units 20 and the black matrix 70 are disposed at one side of the substrate 10, and the positions of the touch control units 20 corresponds to a position of the black matrix 70, as illustrated in FIG. 5. Needless to say, the touch substrate according to embodiments of the present invention may also be an organic light-emitting diode (OLED) substrate or an array substrate, as illustrated in FIG. 6.

In another aspect, embodiments of the present invention provide a display apparatus including the touch substrate described herein.

Optionally, in a case where the touch substrate is the color filter substrate according to the embodiments of the present invention (e.g., as illustrated in FIG. 5), the display apparatus can be obtained by simply aligning the color filter substrate and the array substrate with each other and performing encapsulation.

Figure 6:
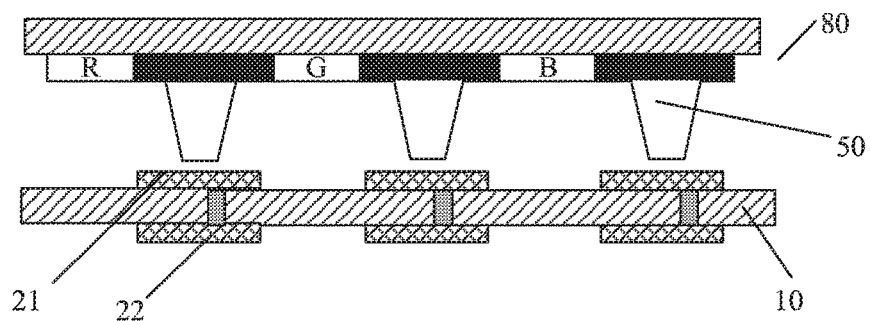
FIG. 6 is a schematic diagram of a display apparatus according to an embodiment of the present invention, in which the touch substrate is an OLED substrate or an array substrate.

As illustrated in FIG. 6, in a case where the touch substrate is an OLED substrate or an array substrate, a counter substrate 80 of the display apparatus is provided with pressure conductive pillars 50 thereon at positions corresponding to the touch control units 20 of the display apparatus, respectively; the pressure conductive pillars 50 and the touch substrate being provided with a gap therebetween. When a press occurs on the display apparatus (for example, on the counter substrate 80), the pressure conductive pillar 50 at the press position transfers the pressure to a corresponding touch control unit 20 to facilitate detection. In addition, spacers (not shown in the drawings a generally disposed between the counter substrate 80 and the touch substrate. In this case, the pressure conductive pillars 50 and the spacers may be disposed at a same layer and made of a same material, and thus no additional process is needed and the cost is low.

The display apparatus may be any product or component with display function, such as an OLED panel, an electronic paper, a mobile phone, a tablet computer, a television, a monitor, a notebook computer, a digital album, a navigator or the like.

It can be understood that the foregoing implementations are merely exemplary embodiments used for describing the principle of the present invention, but the present invention is not limited thereto. Those of ordinary skill in the art may make various variations and improvements without departing from the spirit and essence of the present invention, and these variations and improvements shall also fall into the protection scope of the present invention.

What is claimed is:

1. A touch substrate, comprising a substrate, and a plurality of control lines, a plurality of read lines and a plurality of touch control units disposed on the substrate; wherein
    each of the plurality of touch control units comprises a first patch disposed on a first surface of the substrate, and a second patch disposed on a second surface of the substrate opposite to the first surface, an orthogonal projection of the first patch on the substrate at least partially overlapping with that of the second patch, the first and second patches being electrically connected through a conductive via penetrating the substrate,
    each of the plurality of touch control units is configured to operate under a control of a control signal inputted through a corresponding one of the plurality of control lines, and read out, through a corresponding one of the plurality of read lines, a pressure signal for the first patch and the second patch in the touch control unit so as to determine a position of a touch point at which a press occurs, and
    each of the first patch and the second patch is a resistive strain gauge.

2. The touch substrate according to claim 1, wherein the plurality of control lines and the plurality of read lines intersect and are insulated from each other, each intersection of the plurality of control lines and the plurality of read lines defining one of the touch control units; wherein each of the plurality of touch control units further comprises a switch transistor having a first electrode electrically connected to the first patch and the second patch of the touch control unit, respectively; second electrodes of the switch transistors of the touch control units in a same column are commonly connected to a same one of the plurality of read lines, and control electrodes of the switch transistors of the touch control units in a same row are commonly connected to a same one of the plurality of control lines.

3. The touch substrate according to claim 1, wherein each of the plurality of touch control units further comprises a detecting and amplifying unit, which is configured to convert, to the pressure signal, a difference between a resistance value of the first patch and a resistance value of the second patch of the touch control unit, amplify the pressure signal and output the amplified pressure signal through the read line.

4. The touch substrate according to claim 3, wherein the detecting and amplifying unit is configured to be a bridge detection circuit, and the first patch and the second patch of one touch control unit serve as two respective resistors of a bridge in the detecting and amplifying unit of the one touch control unit.

5. The touch substrate according to claim 4, wherein the detecting and amplifying unit comprises an amplifying circuit, a switch transistor, a first resistor and a second resistor;
    wherein the first resistor, the second resistor, the first patch and the second patch constitute the bridge in the detecting and amplifying unit, a node at which the first resistor and the first patch are connected serving as a first end of the bridge, a node at which the first patch and the second patch are connected serving as a second end of the bridge, a node at which the second patch and the second resistor are connected serving as a third end of the bridge, a node at which the second resistor and the first resistor are connected serving as a fourth end of the bridge;
    the amplifying circuit has a first input port, a second input port and an output port, and is configured to output the pressure signal in a form of voltage; and
    wherein a first electrode of the switch transistor is connected to the second end of the bridge, and a second electrode of the switch transistor is connected to the first input port of the amplifying circuit, and
    the first end of the bridge is connected to a power supply voltage port, the third end of the bridge is connected to a low voltage port or a ground port, and the fourth end of the bridge is connected to the second input port of the amplifying circuit.

6. The touch substrate according to claim 5, wherein the amplifying circuit comprises a fifth resistor, a sixth resistor, a seventh resistor, an eighth resistor and an operational amplifier, and
  wherein the operational amplifier has a positive input port, a negative input port and an output port;
  a first end of the fifth resistor is connected to the first input port of the amplifying circuit, a second end of the fifth resistor is connected to the negative input port of the operational amplifier and a first end of the seventh resistor;
  a first end of the sixth resistor is connected to the second input port of the amplifying circuit, and a second end of the sixth resistor is connected to the positive input port of the operational amplifier and a first end of the eighth resistor;
  a second end of the seventh resistor is connected to the output port of the operational amplifier, which serves as the output port of the amplifying circuit; and
  a second end of the eighth resistor is connected to a reference voltage port.

7. The touch substrate according to claim 4, wherein the bridge is a Wheatstone bridge.

8. A display apparatus, comprising the touch substrate according to claim 3 and a counter substrate disposed opposite to the touch substrate.

9. The touch substrate according to claim 1, further comprising an acquisition unit and a processing unit; wherein
  the acquisition unit is configured to acquire pressure signals which are read through respective read lines; and
  the processing unit is configured to analyze and process the pressure signals to determine the position of the touch point at which the press occurs.

10. A display apparatus, comprising the touch substrate according to claim 9 and a counter substrate disposed opposite to the touch substrate.

11. The touch substrate according to claim 1, wherein each of the first patches and the second patches has a spiral wiring pattern.

12. The touch substrate according to claim 11, wherein the spiral wiring pattern is configured to be a circular spiral wiring pattern or a square spiral wiring pattern.

13. The touch substrate according to claim 1, wherein, in each touch control unit, the orthogonal projection of the first patch on the substrate completely overlaps with that of the second patch.

14. The touch substrate according to claim 1, wherein each of the first electrode and the second electrode is made of any one of constantan, an alloy of nickel and aluminum, a Kama alloy, and an alloy of iron, chromium and aluminum.

15. The touch substrate according to claim 1, wherein the touch substrate is any one of a color filter substrate, an array substrate, and an organic light-emitting diode substrate.

16. The touch substrate according to claim 15, wherein the touch substrate is a color filter substrate including a black matrix, and the touch control units are disposed in correspondence with a position of the black matrix.

17. A display apparatus, comprising the touch substrate according to claim 1 and a counter substrate disposed opposite to the touch substrate.

18. The display apparatus according to claim 17, wherein the touch substrate is an array substrate or an organic light-emitting diode substrate, and the counter substrate is provided with pressure conductive pillars thereon at positions corresponding to the touch control units, respectively, the pressure conductive pillars and the touch substrate being provided with a gap therebetween.

19. The display apparatus according to claim 18, further comprising spacers disposed between the counter substrate and the touch substrate, the spacers and the pressure conductive pillars being disposed at a same layer and made of a same material.

* * * * *